United States Patent [19]
Naji

[11] Patent Number: 5,946,227
[45] Date of Patent: Aug. 31, 1999

[54] MAGNETORESISTIVE RANDOM ACCESS MEMORY WITH SHARED WORD AND DIGIT LINES

[75] Inventor: Peter K. Naji, Phoenix, Ariz.

[73] Assignee: Motorola, Inc., Schaumburg, Ill.

[21] Appl. No.: 09/118,977

[22] Filed: Jul. 20, 1998

[51] Int. Cl.[6] ............................ G11C 11/00; G11C 11/14
[52] U.S. Cl. ............................................. 365/158; 365/171
[58] Field of Search ...................................... 365/158, 171

[56] References Cited

U.S. PATENT DOCUMENTS

| | | | |
|---|---|---|---|
| 5,587,943 | 12/1996 | Torok et al. ............................ | 365/158 |
| 5,732,016 | 3/1998 | Chen et al. ............................. | 365/158 |
| 5,748,519 | 5/1998 | Tehrani et al. ......................... | 365/171 |
| 5,838,608 | 11/1998 | Zhu et al. ............................... | 365/158 |

*Primary Examiner*—Trong Phan
*Attorney, Agent, or Firm*—Eugene A. Parsons; William E. Koch

[57] ABSTRACT

A high speed and high density magnetoresistive random access memory (MRAM) device (30) is provided. The MRAM device employs a poly-silicon word line (39a) that saves wiring space. Further, the word line is connected to a digit line (38a) by a connecting line (44a) which reduces a electrical resistance between transistors (43a) and (40a). Arrangement of the connecting line reduces a transmission time from a digit current control (33a) to transistor (43a) and greatly improves a memory cycle time.

24 Claims, 3 Drawing Sheets

5,946,227

MAGNETORESISTIVE RANDOM ACCESS MEMORY WITH SHARED WORD AND DIGIT LINES

FIELD OF THE INVENTION

The present invention relates to a magnetoresistive random access memory having shared word and digit lines, and more particularly, to a magnetoresistive random access memory having a connecting line between word and digit lines.

BACKGROUND OF THE INVENTION

A magnetoresistive random access memory (MRAM), which is one of non-volatile memory devices, includes a plurality of magnetic memory cells. It is known that the magnetoresistive effect appears in multi-layer films that are alternately stacked by magnetic layers and non-magnetic layers. Magnetic resistance over a magnetic memory cell indicates minimum and maximum values when magnetic vectors in magnetic layers point in same and opposite directions, respectively. The same and opposite directions of magnetic vectors in two magnetic layers are called "Parallel" and "Antiparallel" states, respectively. When magnetic material is employed for a memory device, parallel and antiparallel directions, for example, are logically defined as "0" and "1" states, respectively.

The MRAM device normally arranges magnetic memory cells on intersections of word and sense lines, which are placed in rows and columns. The MRAM circuit, for instance, is described in U.S. patent application Ser. No. 09/055,731 entitled "MAGNETORESISTIVE RANDOM ACCESS MEMORY DEVICE AND OPERATING METHOD THEREOF," filed Apr. 1, 1998 assigned to the same assignee.

Activation of word and sense lines enables the MRAM device to access the memory cell. The sense line is directly coupled to the memory cells and a sense current flows in the magnetic layers so that a sense current is affected by magnetic vectors in the magnetic layers and the sense current value in the memory cell or the voltage drop across the memory cell is alternated according to the direction of magnetic vectors. Sensing the changes in the sense current value or the voltage drop allows one to detect states stored in the memory cells. On the other hand, a writing process is carried out by applying a sufficient magnetic field to switch magnetic vectors in the magnetic layers. In order to meet the magnetic requirements, a torque or digit line is placed in parallel with the word line to provide a digit current. The digit, word, and sense currents all create a total magnetic field and apply it to the memory cell, which stores states in the memory cell in accordance with directions of the total magnetic field.

In order to ensure a sufficient current, digit, word, and sense lines typically employ metal material, which causes a memory cell size to increase for accommodation of all three metal spacing and pitches. Accordingly, a word line is replaced with poly-silicon material to alleviate a space limitation. Replacement to poly-silicon allows an MRAM device to highly integrate memory cells. A poly-silicon line, however, has an increased resistance that causes a transmission delay of a signal on the word line and requires much access time. Therefore, the more memory cells that are integrated, the more access time is needed.

Accordingly, it is a purpose of the present invention to provide an improved MRAM device that has a high-speed operation.

It is another purpose of the present invention to provide an improved MRAM device that has a high density memory cell arrangement.

It is still another purpose of the present invention to provide an improved MRAM device that attains reduction in memory cell size.

SUMMARY OF THE INVENTION

These needs and others are substantially met through provision of a magnetoresistive random access memory (MRAM) device that includes connecting lines coupling between a digit line and a word line. The MRAM device has a plurality of memory cells arrayed in rows and columns. Each memory cell is placed on an intersection of a sense or bit line and a digit line. A word line, which is formed of poly-silicon material, is arranged in parallel with the digit line. The word line connects a plurality of memory cells arranged in a row that form a memory bank. Connecting lines are connected between the digit line and the word line at every N memory cells in the memory bank. The number N is a positive integer. The connecting lines reduce the access time to the memory cell because shared word and digit lines decrease the resistance. Accordingly, connecting lines formed between the word line and the digit line reduce a memory cell size, and highly improve the access time to memory cells.

DETAILED DESCRIPTION OF THE PREFERRED EMBODIMENTS

Figure 1:
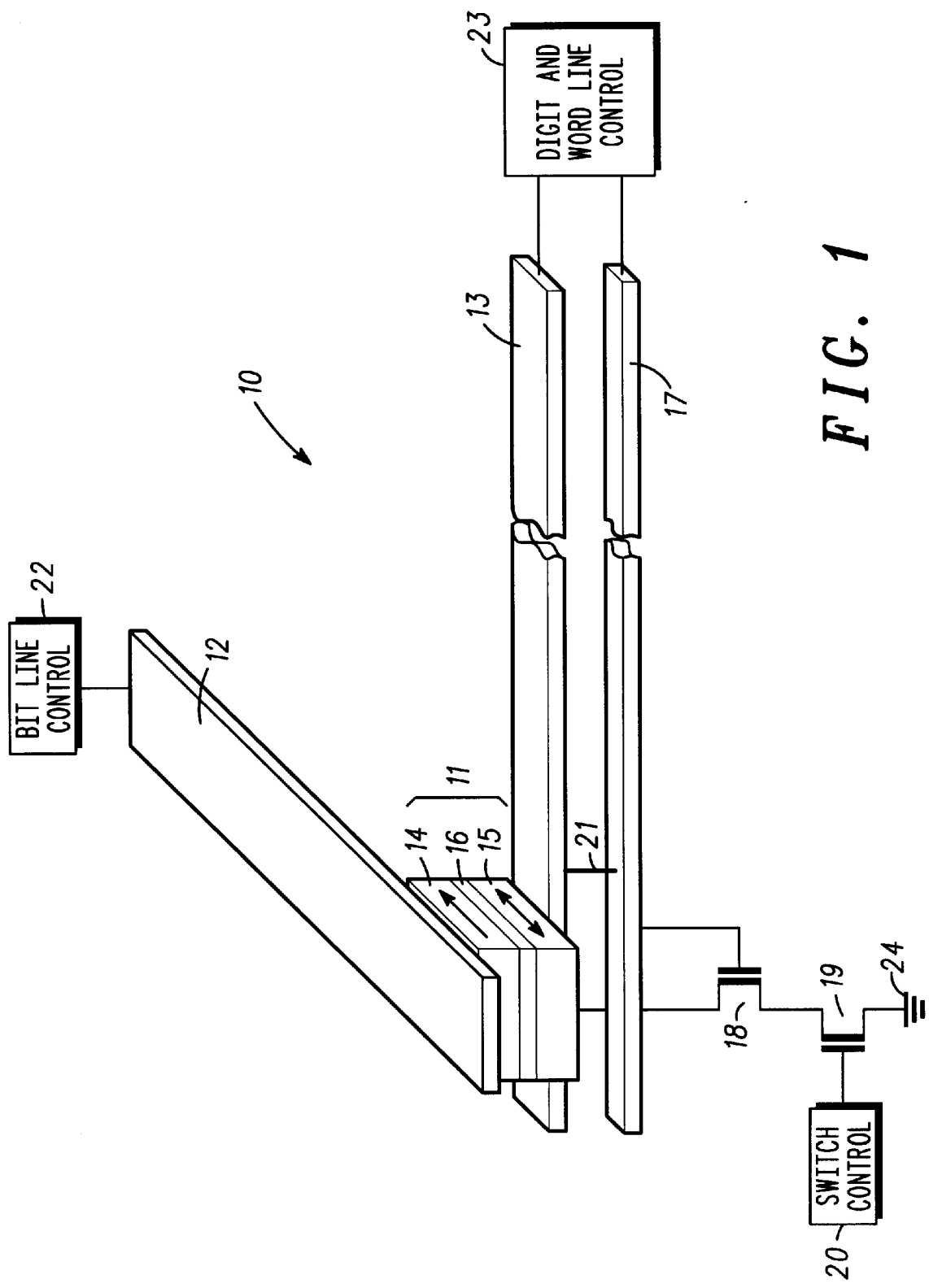
FIG. 1 shows a simplified and schematic circuit diagram for describing a basic concept according to the present invention.

FIG. 1 shows a simplified and schematic circuit diagram 10 that has a magnetic tunneling junction (MTJ) memory cell 11 placed on an intersection of a bit line 12 and a digit line 13. Memory cell 11 has three layers that include magnetic layers 14 and 15 separated by a non-magnetic and insulated layer 16. Insulated layer 16 is very thin and has typically a thickness of 10 Å to 30 Å that forms a tunneling junction between magnetic layers 14 and 15. Magnetic layer 14 is electrically connected to bit line 12 for providing a sense current to memory cell 11. As shown in FIG. 1, for example, memory cell 11 has magnetically pinned and free layers 14 and 15, respectively. Magnetic layer 15 stores information as directions of magnetization vectors therein. A word line 17 is placed in parallel with digit line 13 and is connected to a gate electrode of a memory cell transistor 18. Transistor 18 is connected to layer 15 and a ground switch transistor 19 that is controlled by ground switch control 20. A connecting line 21, which is formed of a metal such as Al, Cu, or TiW, electrically connects digit line 13 to word line 17. Bit line 12 is connected to a bit line control 22, while digit and word lines 13 and 14 are connected to digit and word line control 23. Bit line control 22 and digit and word line control 23 control current flow in bit line 12, digit line 13, and word line 17 on read and write modes. It is understood that the magnetic memory cell can be any combination of magnetic layers sandwiched of an insulator (MTJ) or magnetic layers sandwiched of a conductive layer.

In order to read information stored in memory cell 11, digit and word line control 23 sends a word signal on both word line 17 and digit line 13 that permits transistor 18 to turn on. At the same time, ground switch control 20 turns transistor 19 on. Then, bit line control 22 provides a sense current on bit line 12, which flows through memory cell 11, transistors 18 and 19 to a ground or common line 24. The sense current generates a voltage drop across memory cell 11, which varies according to information in cell 11, that is "Parallel" and "Antiparallel" states. A comparator circuit (not shown) measures the voltage drop and determines states stored in memory cell 11.

Bit line 12 and digit line 13 are both formed by a metal such as aluminum or copper, whereas word line 17 is made of poly-silicon that has higher resistivity than metals. If only word line 17 carries the word signal to transistor 18, the signal transmission is delayed to transistor 18 due to the resistance of word line 17. This means the access time to memory cells greatly increases. In the present invention, connecting line 21 connects digit line 13 to word line 17 so that the resistance between control 23 and transistor 18 is reduced because digit line 13 is made of a metal. Accordingly, the word signal reaches transistor 18 without delay caused by poly-silicon in word line 17.

In a write mode, a bit current and a digit current are provided on bit line 12 and digit line 13, respectively. These currents generate magnetic fields that produce a combined magnetic field. The combined magnetic field has a sufficient magnetic strength to switch magnetic vectors in magnetic layer 15. The writing process carries out the following steps. First of all, ground switch control 20 turns off transistor 19 to avoid current flow from bit line 12 through memory cell 11 and transistors 18 and 19 to common line 24. Next, bit line control 22 provides a bit current on bit line 12 and digit and word line control 23 gives a digit current on digit line 13. Bit and digit lines 12 and 13 designate memory cell 11, to which the combined magnetic field is applied to store or switch states in magnetic layer Referring to FIG. 2, an MRAM device 30 is illustrated, which arranges a plurality of MTJ memory cells in rows and columns. Device 30 is roughly divided into a memory array 31 and a peripheral circuit portion including a bit line control 32, digit current controls 33a and 33b, a digit selector 34, and a switch control 35. Memory array 31 has a plurality of memory cells 36a and 36b (Not numbering all the cells and other elements in FIG. 2.) that are located on intersections of bit lines 37a and 37b and digit lines 38a and 38b. Bit line control 32 extends bit lines 37a on memory array 31 and 37b that are coupled to memory cells 36a and 36b. Digit lines 38a and 38b are coupled to transistors 40a–40d, one of which is selected by digit line selector 34 to supply a digit current. Transistors 40a and 40b further are coupled to transistors 41a and 41b, which determine directions of the digit current along with transistors 42a and 42b under the control of digit current controls 33a and 33b. Word lines 39a and 39b are placed in parallel with digit lines 38a and 38b, and coupled to gate electrodes of transistors 43a and 43b. Connecting lines 44a and 44b electrically connect between digit line 38a and word line 39a, and between digit line 38b and word line 39b. In memory array 31 in FIG. 2, connecting lines 44a and 44b are placed at every two memory cells in rows. Transistors 45a and 45b, which are controlled by switch control 35, connect transistors 43a and 43b to a ground or common line 46.

A reading operation for device 30 basically executes the same steps as the operation of the schematic circuit diagram 10 illustrated in FIG. 1. The following steps describe a reading operation to memory cell 36a, for example, where transistors 43a and 45a and connecting line 44a correspond to transistors 18 and 19 and connecting line 21 in circuit diagram 10 in FIG. 1, respectively.

First of all, digit line selector 34 provides a signal on a line 46 to turn on transistor 40a, by which digit line 38a is activated. Next, to turn on transistor 43a, digit current control 33a turns transistor 41a on and transistor 41b off. As a result, a digital high voltage on a power line 47 is applied through transistor 41a, transistor 40a, digit line 38a and connecting line 44a to the gate electrode of transistor 43a. Finally, switch control 35 sends a turn-on signal to transistor 45a, which allows a sense current to travel from bit line control 32 through bit line 37a, memory cell 36a transistor 43a, and transistor 45a to common line 46. The sense current generates a voltage drop across memory cell 36a, which is evaluated by a comparator circuit (not shown) to determine states stored in memory cell 36a.

As mentioned earlier, a combined magnetic field determines directions of magnetic vectors in the memory cell and stores states therein. In device 30, current flow directions in a digit line establish states in the memory cell. For example, it is assumed that digit currents on line 38a flowing to the right and left directions indicated by arrows 49 and 50 store a logic "0" and a logic "1" in the memory cell, respectively.

For writing a logic "0" in memory cell 36a, digit line selector 34 turns on transistor 40a to activate digit line 38a. Switch control 35 turns off transistor 45a to keep a current from flowing in memory cell 36a before bit line control 32 provides a bit current on bit line 37a. Then, current control 33a switches transistor 41a to turn off and transistor 41b to turn on, while current control 33b turns transistor 42a on and transistor 42b off. Consequently, the digit current indicated by arrow 49 flows from a power line 51 through transistor 42a, digit line 38a, transistor 40a, and transistor 41b to common line 46. A magnetic field generated by the digit current on digit line 38a is combined with a magnetic field generated by the bit current on bit line 37a to produce a combined magnetic field that determines the direction in magnetic vectors in memory cell 36 and stores the logic "0."

Alternatively, in order to store a logic "1," a digit current represented by arrow 50 is provided in digit line 38a. First, digit line selector 34 selects digit line 38a by turning on transistor 40a, while transistor 45a is shut off. Digit current control 33a allows transistors 41a and 41b to turn on and off, respectively. At the same time, transistors 42a and 42b are turned off and on by current control 33b, respectively. As a result, a digit current route, which is from power line 47 through transistor 41a, transistor 40a, digit line 38a, and transistor 42a to common line 46, is formed. Bit line control 32 provides a bit current on bit line 37a, which forms a combined magnetic field along with a magnetic field generated by the digit current.

Figure 2:
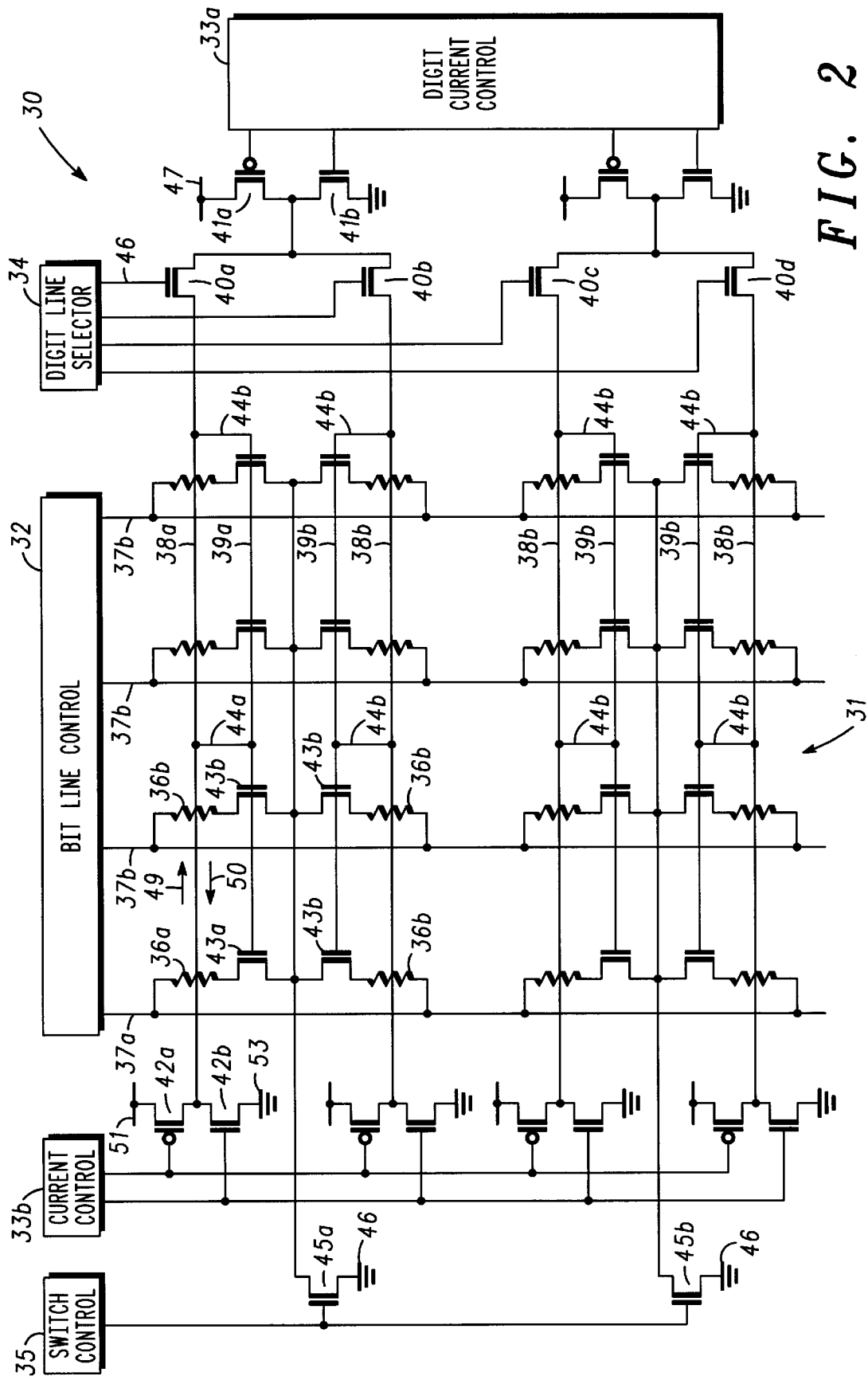
FIG. 2 shows an MRAM device circuit employing the present invention.

In FIG. 2, memory cell 36a is connected to transistor 43a in series, which forms a memory element. Each digit line, to a row direction, has a plurality of memory elements, which is called a memory bank. That is, memory array 31 includes a plurality of memory banks, each memory bank is activated by digit line selector 34. Memory banks shown in FIG. 2 have connecting lines 44a and 44b that are formed at every two memory elements in memory banks.

Figure 3:
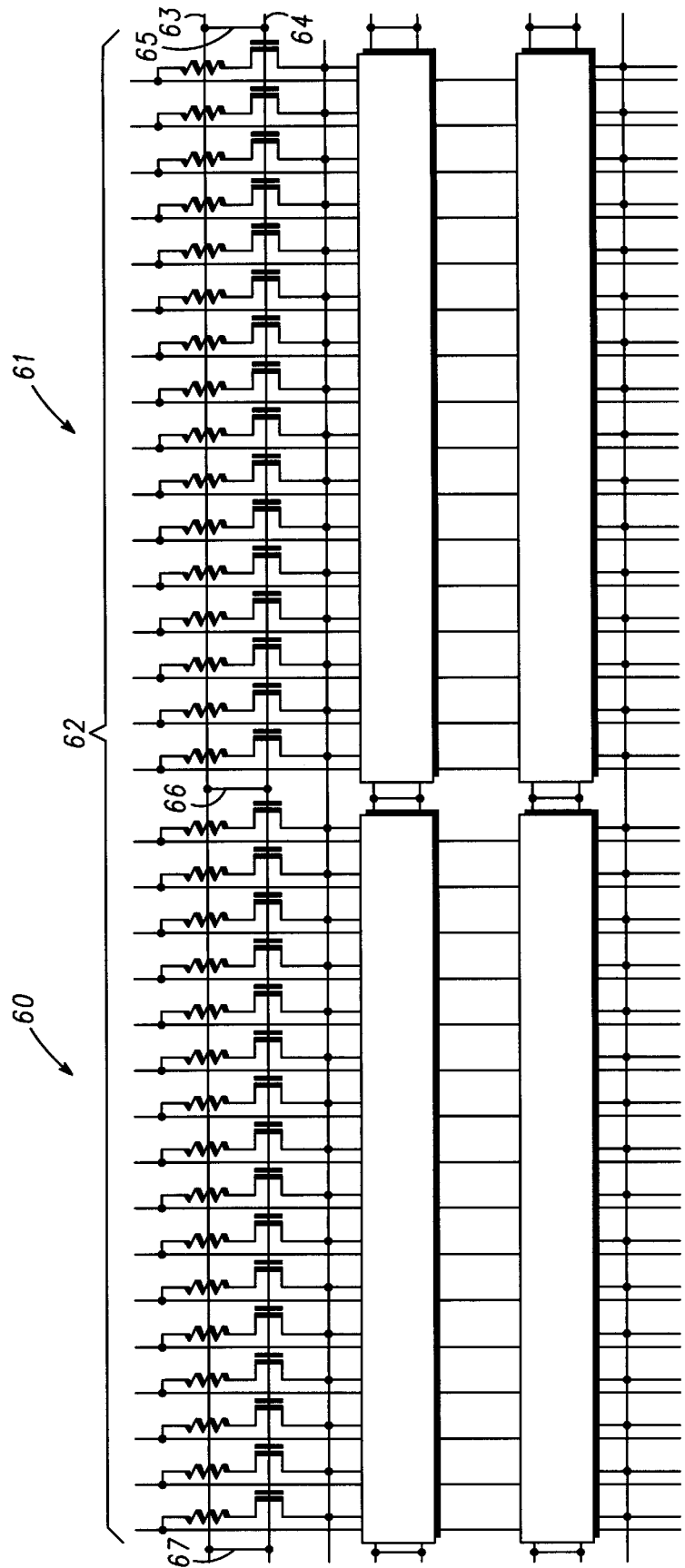
FIG. 3 shows another embodiment for a memory bank circuit in an MRAM device.

Referring to FIG. 3, another circuit configuration is illustrated for a memory array 60. A memory bank 61, for example, has a plurality of memory elements in parallel, and each memory element has a memory cell and a transistor connected in series. These memory cells position on intersections of a plurality of bit lines 62 and a digit line 63. A word line 64 is placed in parallel with digit line 63. Memory bank 61 basically is the same as the circuit in FIG. 2 except for the connecting lines. In memory bank 61, connecting lines 65–67 are arranged at every 16 memory elements for connecting digit line 63 to word line 64. Generally speaking, connecting lines are placed between the digit line and the word line at every N memory elements, where the N is a positive integer number and is determined according to electrical resistivity of a word line.

Thus, a word line employs poly-silicon that allows an MRAM device to save space for wiring and to increase memory density. Furthermore, since connecting lines electrically connect a digit line to a word line at every N memory element, the resistance of the word line is substantially decreased along with a digit line, a memory access time is greatly improved and a total cycle for reading is highly reduced.

What is claimed is:

1. A magnetic random access memory unit comprising:
    a memory element including:
        a magnetic memory cell having first and second magnetic layers separated by a non-magnetic layer; and
        a memory cell switch being connected in series to the magnetic memory cell for activating the magnetic memory cell;
    a bit line being placed on the first magnetic layer and electrically coupled to the first magnetic layer;
    a digit line being placed adjacent the memory cell, electrically isolated from the memory cell, and perpendicularly placed to the bit lines;
    a word line being placed in parallel to the digit line and coupled to the memory cell switch for controlling the memory cell switch; and
    a connecting line for electrically connecting the digit line to the word line.

2. The magnetic random access memory unit as claimed in claim 1 further including a ground switch for coupling the magnetic memory cell to a common line, wherein the ground switch is turned on for providing a sense current to the magnetic memory cell on a read mode.

3. The magnetic random access memory unit as claimed in claim 2 wherein the memory cell switch is a transistor having first, second and gate electrodes, the first electrode being coupled to the second magnetic layer, the second electrode being coupled to the ground switch, and the gate electrode being coupled to the word line.

4. The magnetic random access memory unit as claimed in claim 1 wherein, on a write mode, a bit current and a digit current are provided on the bit line and the digit line, respectively, so that the bit current and the digit current generate magnetic fields, respectively, a combined magnetic field of which determines directions of magnetic vectors in the magnetic memory cell.

5. The magnetic random access memory unit as claimed in claim 1 wherein the first magnetic layer is magnetically free and the second magnetic layer is magnetically pinned so that information is stored in the first layer as directions of magnetization vectors.

6. The magnetic random access memory unit as claimed in claim 1 wherein the bit line and the digit line are made of metal, and the word line is made of poly-silicon.

7. The magnetic random access memory unit as claimed in claim 1 wherein the magnetic memory cell has a tunneling junction between the first and second magnetic layers.

8. A magnetic random access memory bank comprising:
    a plurality of memory elements, each memory element including:
        a magnetic memory cell having first and second magnetic layers separated by a non-magnetic layer; and
        a memory cell switch being connected in series to the magnetic memory cell for activating the magnetic memory cell;
    a plurality of bit lines, each bit line being placed on the first magnetic layer and electrically coupled to the first magnetic layer;
    a digit line being placed adjacent the memory cell, electrically isolated from the memory cell and perpendicularly placed to the bit lines;
    a word line being placed in parallel to the digit line and coupled to memory cell switches for controlling the memory cell switches; and
    a plurality of connecting lines for electrically connecting the digit line to the word line at every N memory elements, wherein the N is a predetermined positive integer number.

9. The magnetic random access memory bank as claimed in claim 8 further including a ground switch for coupling magnetic memory cells to a common line, wherein the ground switch is turned on for providing a sense current to one of the magnetic memory cells on a read mode.

10. The magnetic random access memory unit as claimed in claim 8 wherein, on a write mode, a bit current and a digit current are provided on one of the bit lines and the digit line, respectively, so that the bit current and the digit current generate magnetic fields, respectively, a combined magnetic field of which determines directions of magnetic vectors in the magnetic memory cell.

11. The magnetic random access memory bank as claimed in claim 8 wherein the first magnetic layer is magnetically free and the second magnetic layer is magnetically pinned so that information is stored in the first layer as directions of magnetization vectors.

12. The magnetic random access memory bank as claimed in claim 8 wherein the bit line and the digit line are made of metal, and the word line is made of poly-silicon.

13. The magnetic random access memory unit as claimed in claim 8 wherein the magnetic memory cell has a tunneling junction between the first and second magnetic layers.

14. A magnetic random access memory device comprising:
    a memory array including a plurality of memory elements arranged in rows and columns, each memory element having:
        a magnetic memory cell including first and second magnetic layers separated by a non-magnetic layer; and
        a memory cell switch being connected in series to the magnetic memory cell for activating the magnetic memory cell;
    a plurality of bit lines, each bit line being placed on first magnetic layers of magnetic memory cells arranged in a column line and electrically coupled to the first magnetic layers;
    a plurality of sets of digit and word lines, each set of digit and word lines having:
        a digit line being placed adjacent memory cells arranged in a row line, electrically isolated from the memory cells, and perpendicularly placed to the plurality of bit lines; and
        a word line being placed in parallel with the digit line and coupled to memory cell switches arranged in the row line for controlling the memory cell switches;

a plurality of sets of connecting lines, each set of connecting lines for electrically connecting between the digit line and the word line at every N memory elements in the row line, wherein the N is a predetermined positive integer number;

a bit line controller, coupled to the plurality of bit lines, for selecting one of the plurality of bit lines; and a digit line controller, coupled to the plurality of digit lines, for selecting one of the plurality of digit lines.

15. The magnetic random access memory device as claimed in claim 14 wherein memory elements are placed on intersections of bit lines and digit lines.

16. The magnetic random access memory device as claimed in claim 14 further including at least a ground switch for coupling magnetic memory cells to a common line, wherein the ground switch is turned on for providing a sense current to one of the magnetic memory cells on a read mode.

17. The magnetic random access memory device as claimed in claim 14 wherein the bit line controller provides a bit current on one of the bit lines and the digit line controller provides a digit current on one of the digit lines, so that the bit current and the digit current generate magnetic fields, respectively, a combined magnetic field of which determines directions of magnetic vectors in the magnetic memory cell.

18. The magnetic random access memory device as claimed in claim 14 wherein the bit lines and the digit lines are made of metal, and the word lines are made of polysilicon.

19. The magnetic random access memory device as claimed in claim 14 wherein the bit line controller includes a current source for providing a current to a bit line selected by the bit line controller.

20. The magnetic random access memory device as claimed in claim 14 wherein the bit line controller includes:

a bit line selector for selecting one of the plurality of bit lines; and a bit current source for providing a bit current into the one of the plurality of bit lines selected by the bit line selector.

21. The magnetic random access memory device as claimed in claim 20 wherein the bit line controller determines directions of the bit current according to information to be stored in the magnetic memory cell.

22. The magnetic random access memory device as claimed in claim 14 wherein the digit line controller includes:

a digit line selector for selecting one of the plurality of sets of digit and word lines; and a digit current source for providing a digit current into the one of the plurality of sets of digit and word lines selected by the digit line selector.

23. The magnetic random access memory device as claimed in claim 22 wherein the digit current controller determines directions of the digit current according to information to be stored in the magnetic memory cell.

24. The magnetic random access memory unit as claimed in claim 14 wherein the magnetic memory cell has a tunneling junction between the first and second magnetic layers.

* * * * *

UNITED STATES PATENT AND TRADEMARK OFFICE
CERTIFICATE OF CORRECTION

PATENT NO.    : 5,946,227
DATED         : August 31, 1999
INVENTOR(S)   : Naji

It is certified that error appears in the above-identified patent and that said Letters Patent is hereby corrected as shown below:

<u>Column 1,</u>
Line 3, after the Title, please add as a new first paragraph the following paragraph:
    -- This invention was made with Government support under Agreement No. MDA972-96-3-0016 awarded by DARPA. The Government has certain rights in the invention. --

Signed and Sealed this

Nineteenth Day of August, 2003

JAMES E. ROGAN
*Director of the United States Patent and Trademark Office*